United States Patent [19]

Cavaliere et al.

[11] 4,308,469
[45] Dec. 29, 1981

[54] UNITY GAIN EMITTER FOLLOWER BRIDGE CIRCUIT

[75] Inventors: Joseph R. Cavaliere, Hopewell Junction; Robert A. Henle, Clinton Corners; Richard R. Konian, Poughkeepsie; James L. Walsh, Hyde Park, all of N.Y.

[73] Assignee: International Business Machines Corp., Armonk, N.Y.

[21] Appl. No.: 97,013

[22] Filed: Nov. 23, 1979

[51] Int. Cl.³ ................ H03K 19/013; H03K 19/086; H03K 19/20

[52] U.S. Cl. .................................. 307/455; 307/262; 307/296 R; 307/313

[58] Field of Search ............... 307/218, 255, 262, 296, 307/313; 330/267, 263, 296

[56] References Cited

U.S. PATENT DOCUMENTS

3,077,545  2/1963  Rywak ............................ 307/88.5
3,265,906  8/1966  Feller ............................. 307/88.5

OTHER PUBLICATIONS

H. Mukai & K. Kataoka, *Review of the Electrical Communication Laboratories*, vol. 26, No. 9-10, Sep.-Oct. 1978, "Master Slice ECL LSI", pp. 1325-1338, FIG. 5a, p. 1328, right col., 1.12-p. 1330, left col., 1.8.

*IBM Technical Disclosure Bulletin*, vol. 18, No. 6, Nov. 1975, Prilik: "High-Speed Voltage Current Pulser", pp. 1930-1932; FIG. 2; p. 1932, 1.16-1.19.

*Primary Examiner*—John Zazworsky
*Attorney, Agent, or Firm*—Robert J. Haase

[57] ABSTRACT

A high speed, unity gain, emitter follower OR circuit is disclosed including first and second pairs of emitter-connected complementary bipolar transistors with the bases of the NPN transistors being connected together and the bases of the PNP transistors being connected commonly to an input line. One of the NPN transistors id diode-connected (base to collector). The emitter of the other NPN transistor is connected to an output terminal. The input line is connected to the emitters of a pair of OR input NPN transistors and to a first current source. A second current source is coupled to the diode-connected NPN transistor.

6 Claims, 1 Drawing Figure

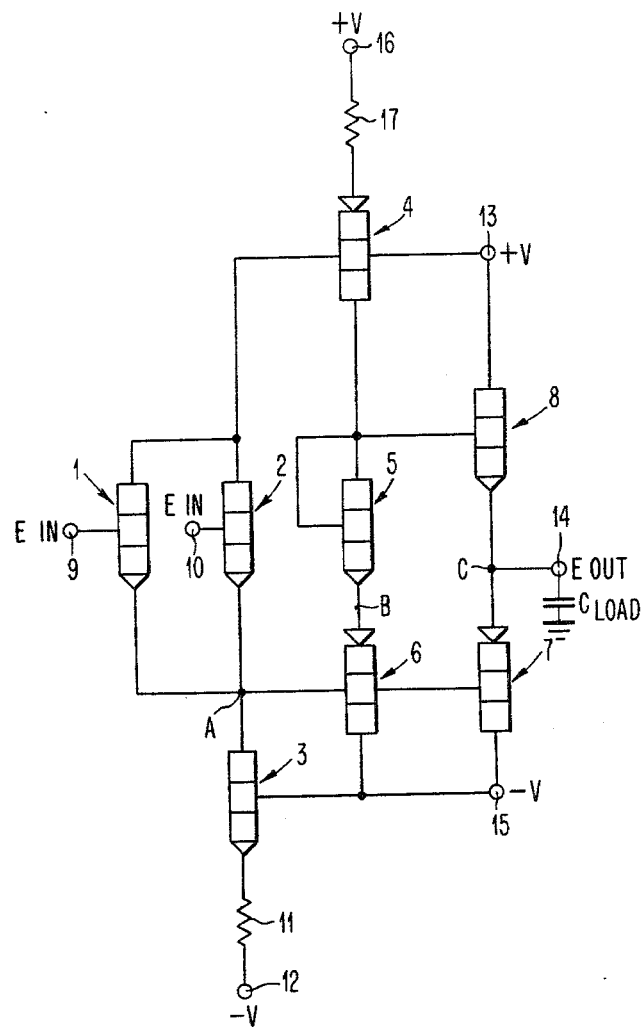

UNITY GAIN EMITTER FOLLOWER BRIDGE CIRCUIT

DESCRIPTION

BACKGROUND OF THE INVENTION

1. Field of the Invention

The invention generally relates to emitter follower logic circuits using complementary transistors and, more particularly, to such circuits characterized by unity gain, no level shift, low power consumption and high speed in responding to input signal transitions of either increasing or decreasing sense.

2. Description of Prior Art

As is well known, a capacitively loaded emitter follower circuit using complementary transistors such as shown, for example, in FIG. 8–36 on page 304 of the text *Pulse, Digital and Switching Waveforms*, by J. Millman and H. Taub, McGraw Hill, 1965, provides an output waveform having rising edges and falling edges that follow (with comparable speed) the corresponding rising and falling edges of the input waveform. In the example given, however, the bases of the series-connected complementary transistors are driven by the same input waveform whose voltage excursions turn each transistor on and off.

This necessitates a relatively large input voltage excursion, at least equal to the sum of the $V_{be}$'s for forward biasing the emitter-base junctions of the two transistors, and represents a significant power expenditure.

Furthermore, the cited emitter follower circuit provides less than unity gain so that the signal losses must be overcome by auxiliary drivers in order to cascade the circuits. Additionally, the cited circuit shifts the level of the signal between input and output, by at least one $V_{be}$, requiring a translator to eliminate the level shift when designing cascaded logic.

It is desirable that the complementary emitter follower circuit be modified to avoid level shift, and to provide unity gain while reducing the required input voltage excursion so as to maximize the response speed of the circuit.

SUMMARY OF THE INVENTION

A high speed, unity gain, emitter follower OR circuit introducing no level shift is achieved using two current sources, an input pair of bipolar transistors and a bridge connection of two pairs of complementary bipolar transistors. The circuit is characterized by equally fast response to rising excursions and to falling excursions of input pulsed signals. One of the current sources powers the input pair of transistors while the other current source powers the pair of complementary transistors on the input side of the bridge. By virtue of the current source and the bridge connection, the emitters of each of the transistors follow their respective bases with unity gain.

BRIEF DESCRIPTION OF THE DRAWING

The sole FIGURE is a schematic circuit diagram of a preferred embodiment of the invention.

DESCRIPTION OF THE PREFERRED EMBODIMENT

Referring to the FIGURE, input NPN transistors 1 and 2 are connected in parallel in conventional OR logic fashion, with the bases being coupled to receive respective input signals applied to terminals 9 and 10. The commonly connected emitters (point A) of transistors 1 and 2 are coupled to the collector of NPN transistor 3. The emitter of transistor 3 is connected via resistor 11 to a negative potential source at terminal 12. The commonly connected collectors of transistors 1 and 2 and the base of transistor 4 are coupled to a positive potential source at terminal 13.

A first pair of complementary transistors 5 and 6 are connected emitter-to-emitter (point B). The emitters of a second pair of complementary transistors 7 and 8 are also connected to each other (point C) and to capacitively loaded ($C_{LOAD}$) output terminal 14. Preferably, the $V_{be}$'s and the ($f_t$'s) of the NPN and PNP transistors have similar values so that the D.C. level shift between input terminals 9 and 10 and output terminal 14 is minimized and so that the output signal at terminal 14 follows input signals at terminals 9 and 10 with similar speed for rising as well as falling signal excursions.

The base of transistor 3 and the collectors of transistors 6 and 7 are coupled to a negative voltage source at terminal 15. The base-collector node of diode-connected transistor 5 is connected to a positive voltage source at terminal 16 via resistor 17 and the emitter-collector current path of PNP transistor 4. Transistors 3 and 4, with their associated emitter resistors 11 and 17, function as respective constant current sources for input transistor pair 1 and 2 and for the input complementary transistor pair 5 and 6 of the bridge configuration comprising transistors 5, 6, 7 and 8.

In operation, the D.C. offset of two $V_{be}$'s, provided between the bases of transistors 5 and 6, match the corresponding offset required between the bases of transistors 7 and 8. Accordingly, the quiescent voltage at the emitters (point A) of input transistor pair 1 and 2 is set so that transistors 7 and 8 simultaneously are placed at their respective thresholds of conduction. Thus, assuming, for example, that input 9 is up and input 10 is down and then the signal at input terminal 9 begins to fall, causing a corresponding fall at point A, transistor 7 immediately begins to conduct while transistor 8 immediately ceases to conduct. A transient excursion of only a fraction of a $V_{be}$ is sufficient to produce these results whereby very fast response occurs to a falling input signal excursion as compared to state-of-the-art complementary emitter follower circuits. Similarly, when both inputs 9 and 10 are down and an input signal excursion of increasing sense occurs at terminal 9, transistor 8 immediately begins to conduct while transistor 7 immediately ceases to conduct.

It is to be noted that the current source comprising transistor 3 and resistor 11 imparts unity gain to the input emitter follower pair 1 and 2. Similarly, the current source comprising transistor 4 and resistor 17, together with diode-connected transistor 5, imparts unity gain to emitter follower 6. Thus, the potential at point A follows that of points 9 and 10 with unity gain while the potential at point B follows that of point A with the same unity gain. By virtue of the bridge arrangement of transistors 5, 6, 7 and 8 and the matched $V_{be}$'s thereof, the potential of point C closely tracks that of point B also with unity gain.

The D.C. offset of one $V_{be}$ from the base to the emitter of NPN transistor 1 or 2 is negated by the equal and opposite D.C. offset of one $V_{be}$ from the emitter to the base of PNP transistor 6. Inasmuch as point C tracks point B as previously explained, there is no net D.C.

offset acting between output terminal 14 and either of input terminals 9 or 10.

Typical parameter values for the circuit shown in the FIGURE are as follows:

| Voltage Sources | Volts |
|---|---|
| 12 | −2 |
| 13 | +0.8 |
| 15 | −0.8 |
| 16 | +2 |

| Resistors | Ohms |
|---|---|
| 11 | 1K |
| 17 | 1K |

We claim:
1. A circuit comprising
a first pair of complementary bipolar transistors having emitters directly connected to each other
a second pair of complementary bipolar transistors having emitters directly connected to each other and to an output terminal
the bases of the transistors of similar kind of said first and second pairs of transistors being directly connected to each other,
one of the transistors of said first pair of transistors having base and collector directly connected together,
a plurality of input transistors of the same type as said one of said transistors,
the base of the other transistor of said first pair of transistors being connected to the emitters of said input transistors,
the bases of said input transistors being connected to respective input terminals,
a first current source connected to the emitters of said input transistors,
a second current source connected to the collector of said one of said transistors, and
means for biasing the collectors of said transistors other than said one of said transistors.
2. The circuit defined in claim 1 wherein said input transistors are NPN type.
3. The circuit defined in claim 1 wherein the voltages for forward biasing the emitter base junctions ($V_{be}$'s) of said transistors are approximately equal to each other.
4. The circuit defined in claim 1 wherein the ($f_t$'s) of said transistors are approximately equal to each other.
5. The circuit defined in claim 1 wherein the voltages for forward biasing the emitter base junctions ($V_{be}$'s) and the $f_t$'s of said transistors are approximately equal to each other.
6. The circuit defined in claim 1 wherein the voltages for forward biasing the emitter base junctions ($V_{be}$'s) of said first pair of transistors are equal to each other and the $V_{be's}$ of said second pair of transistors are equal to each other.

* * * * *